United States Patent [19]

Nasu et al.

[11] Patent Number: 5,374,570
[45] Date of Patent: Dec. 20, 1994

[54] METHOD OF MANUFACTURING ACTIVE MATRIX DISPLAY DEVICE USING INSULATION LAYER FORMED BY THE ALE METHOD

[75] Inventors: Yasuhiro Nasu, Sagamihara; Kenji Okamoto, Hiratsuka; Jun-ichi Watanabe, Kawasaki; Tetsuro Endo, Atsugi; Shinichi Soeda, Hiratsuka, all of Japan

[73] Assignee: Fujitsu Limited, Kawasaki, Japan

[21] Appl. No.: 109,109

[22] Filed: Aug. 19, 1993

Related U.S. Application Data

[63] Continuation of Ser. No. 915,390, Jul. 20, 1992, abandoned, which is a continuation of Ser. No. 487,088, Mar. 2, 1990, abandoned.

[30] Foreign Application Priority Data

Mar. 17, 1989 [JP] Japan .................................. 1-66762

[51] Int. Cl.$^5$ .......................................... H01L 21/265
[52] U.S. Cl. ...................... 437/40; 437/108; 437/181; 437/236; 437/913
[58] Field of Search ............. 437/2, 3, 4, 5, 105, 437/108, 111, 181, 235, 966, 40; 148/DIG. 169, 236

[56] References Cited

U.S. PATENT DOCUMENTS

| | | | |
|---|---|---|---|
| 4,058,430 | 11/1977 | Suntola et al. | 427/255.4 |
| 4,389,973 | 6/1983 | Suntola et al. | 427/255.7 |
| 4,413,022 | 11/1983 | Suntola et al. | 427/255.7 |
| 4,486,487 | 12/1984 | Skarp | 437/235 |
| 4,601,097 | 7/1986 | Shimbo | 437/59 |
| 4,772,099 | 9/1988 | Kato et al. | 350/336 |
| 4,804,558 | 2/1989 | Saitoh et al. | 427/255.2 |
| 4,859,623 | 8/1989 | Busta | 437/59 |
| 4,880,475 | 11/1989 | Lindmayer | 427/66 |

OTHER PUBLICATIONS

"Growth of α-Al$_2$O$_3$ Films by Molecular Layer Epitaxy", Oya et al, Applied Physics Letters, vol. 51, No. 15, 12th Oct. 1987, pp. 1143–1145.

"An Amorphous Si TFT Array with TaOx/SiNx Double Layered Insulator for Liquid Crystal Displays", Takeda et al, 1988 International Display Research Conference, 4th–6th Oct. 1988, pp. 155–158.

"Ion Beam Analysis of Multilayer Structures Grown with Atomic Layer Epitaxy (Ale)", Lappalainen et al, Thin Solid Films, vol. 181, 10th Dec. 1989, pp. 259–266.

*Primary Examiner*—Brian E. Hearn
*Assistant Examiner*—Michael Trinh
*Attorney, Agent, or Firm*—Armstrong, Westerman, Hattori, McLeland & Naughton

[57] ABSTRACT

A method of manufacturing an active matrix display device, in which particular emphases are laid on the forming step of an insulation layer by the ALE method and the precedent and subsequent steps thereof, thereby insulation layer being anyone among gate insulation layer, inter-busline insulation layer, protection layer and auxiliary capacitor insulation layer comprised in the display device. The method of forming the insulation layer comprises the predetermined number of repeated cycles of the steps of subjecting a substrate to the vapor of a metal inorganic/organic compound, which can react with H$_2$O and/or O$_2$ and form the metal oxide, under molecular flow condition for duration of depositing almost a single atomic layer, and next subjecting the surface of thus formed metal inorganic/organic compound layer to the H$_2$O vapor and/or O$_2$ gas under molecular flow condition for duration of replacing the metal inorganic/organic compound layer to the metal oxide layer. The subsequent steps after forming of the insulation layer include deposition steps of silicon nitride and amorphous silicon layers using the same plasma CVD apparatus. The molecular flow condition is obtained by maintaining the pressure in a reaction chamber within a range between 1 and several tens of milli-Torr.

18 Claims, 8 Drawing Sheets

METHOD OF MANUFACTURING ACTIVE MATRIX DISPLAY DEVICE USING INSULATION LAYER FORMED BY THE ALE METHOD

This is a continuation of Ser. No. 07/915,390 filed Jul. 20, 1992 ; now abandoned which is a continuation of parent application Ser. No. 07/487,088 filed Mar. 2, 1990, now abandoned.

BACKGROUND OF THE INVENTION

1. Field of the Invention

This invention relates to a method of manufacturing an active matrix display device, and more particularly to a method of forming insulation layers used in the active matrix display device. In the active matrix display device, a plurality of display elements are arranged in rows and columns and driven by a plurality of thin film transistors located at each display element position. The insulation layers are used for forming thin film transistors, in which a gate insulation layer and a protection layer covering the thin film transistor are formed. Further, two groups of bus lines are formed on a substrate in the row and column directions respectively to drive the thin film transistors, and two groups are to be insulated from each other at the crossing points by an inter-busline insulation layer. In some cases, the active matrix display device provides an auxiliary capacitor for each display element, the capacitor having a capacitor insulation layer. The present invention relates to the method of forming any of the above insulation layers.

2. Description of the Related Art

Thin film transistors (hereinafter abbreviated as TFT) are used in an active matrix display device to drive each display element. The TFT has a gate insulation layer formed between a gates electrode and an amorphous silicon semiconductor layer. In Order to drive each TFT, gate bus lines and drain bus lines are formed in the row and column directions respectively. The gate bus line and drain bus line must be insulated from each other by insulation layer at the crossing point. Further, it is necessary to cover and to protect at least TFT region with an protection layer at the final stage of fabrication of a substrate.

Thus insulation layers are needed at different portions of the display device structure and are formed at different phases in fabrication. In active matrix display devices having TFTs, materials such as indium tin oxide (abbreviated as ITO), amorphous silicon and aluminum are utilized. These materials require process temperatures as low as possible during=the processes. Therefore, insulation layers are preferably deposited at low substrate temperatures which will not cause bad effects on the grown material. A plasma CVD method is known as a low temperature CVD process and is widely used in manufacturing active matrix display devices.

In forming the TFT, for example, a metal layer is first deposited on a substrate and is patterned, with a result of forming a gate electrode. A gate insulation layer is next formed thereon. The gate insulation layer is of silicon nitride ($SiN_x$) or silicon oxynitride (SiON), and is formed on the substrate by the plasma CVD method, in which the substrate temperature is maintained at around 350° C. Thereafter, an amorphous silicon (a-Si:H) is deposited on the surface of the gate insulation layer using the same plasma CVD apparatus without a break of vacuum, only source gases being changed. After patterning the amorphous silicon layer, source and drain electrodes are formed thereon, thus the TFTs are formed on the substrate.

In the similar way, an inter-busline insulation layer, which insulates gate bus lines from drain (or source) bus lines, is formed by the plasma CVD method. Sometimes, the inter-busline insulation layer is formed simultaneously with the forming step of gate insulation layer using the same plasma CVD apparatus.

The substrate (first substrate) is sealed with another opposite (second) substrate at the final stage of display device fabrication, and light influencing material such as liquid crystal is sealed between two substrates. Therefore, another insulation layer is necessary in order to protect amorphous silicon (a-Si:H) portions on the first substrate before the sealing process. The protection (insulation) layer is deposited at least on the TFT portions in the similar way.

In order to improve picture quality of active matrix display devices, it is known that an auxiliary capacitor is formed in the display device arranged at each corresponding position to the display elements. In this case, a transparent electrode of the display element connected to the source electrode of the TFT is utilized as a first electrode of the auxiliary capacitor, and either an extended portion of the adjacent gate bus line or a separately formed earth busline is utilized as a second capacitor electrode, thereby a capacitor insulation layer being formed between these two electrodes of the auxiliary capacitor.

Existing four kinds of insulation layers such as gate insulation layer, inter-busline insulation layer, protection layer and capacitor insulation layer, which are generally formed by the known plasma CVD method at low temperatures, have essentially a drawback of poor covering capability when deposited on the substrate surface having steps. The formed insulation layer is weak in mechanical strength and easily forms cracks, resulting in decreasing a withstanding voltage and insulation resistance of the insulation layer.

Replacing the existing plasma CVD method, other CVD methods having a different idea of deposition are disclosed in the following patents:

U.S. Pat. No. 4,058,430 issued on Nov. 15, 1977 to Tuomo Suntola etal. entitled "Method for producing compound thin films";

U.S. Pat. No. 4,486,487 issued on Dec. 4, 1984 to Jarmo I. Skarp entitled "Combination film, in particular for thin film electroluminescent structures"; and U.S. Pat. No. 4,389,973 issued on Jan. 28, 1983 to Tuomo S. Suntola etal. entitled "Apparatus for performing growth of compound thin films".

The principle of the above disclosures is to utilize in common the so-called "atomic layer epitaxy" method which is abbreviated as "ALE" method.

The method of U.S. Pat. No. 4,058,430 comprises the steps of subjecting the substrate to the vapor of a first kind of element forming a single atomic layer, and subjecting thus formed surface of the single atomic layer to the vapor of a second kind of element which can react with the first element resulting in forming a single layer of compound of first and second elements. These steps are repeated until a desired thickness can be obtained. The method discloses formation of thin films of light emitting semiconductor or resistance layers.

U.S. Pat. No. 4,486,487 discloses a method of forming a combination film of aluminum oxide and titanium oxide utilizing the ALE method.

U.S. Pat. No. 4,389,973 discloses a method and an apparatus for forming a compound thin films such as tantalum oxide, zinc sulphide and aluminum oxide by the ALE method emphasizing the apparatus used therefor.

SUMMARY OF THE INVENTION

It is a general object of the invention, therefore to provide a method of manufacturing an active matrix display device using the insulation layer, which is grown by the ALE method and is strong against electrical breakdown and has almost no defects such as cracks and pinholes.

It is a more specific object of the invention to provide a method of manufacturing an active matrix display device, wherein a gate insulation layer of thin film transistor of the display device is formed of the insulation layer grown by the ALE method.

It is another object of the invention to provide a method of manufacturing an active matrix display device, wherein a inter-busline insulation layer of the display device is formed of the insulation layer grown by the ALE method.

It is still another object of the invention to provide a method of manufacturing an active matrix display device, wherein a protection layer covering thin film transistor of the display device is formed of the insulation layer grown by the ALE method.

It is further object of the invention to provide a method of manufacturing an active matrix display device, wherein auxiliary capacitor is formed to each display element and a capacitor insulation layer thereof is formed of the insulation layer grown by the ALE method.

It is still further object of the invention to provide a method of forming a composite insulation layer comprising different composition layers formed by the ALE method.

It is still further object of the invention to provide a method of forming a thin film transistor, wherein an amorphous silicon is used as an active semiconductor layer and the insulation layer formed by the ALE method is used as a gate insulation layer.

The above objects are achieved by the method of forming the insulation layer in accordance with the present invention, the method comprising the predetermined number of repeated cycles of the steps of subjecting a substrate to the vapor of a metal inorganic/organic compound, which can react with $H_2O$ and/or $O_2$ and form the metal oxide, under molecular flow condition for duration of depositing almost a single atomic layer, and next subjecting the surface of thus formed metal inorganic/organic compound layer to the $H_2O$ vapor and/or $O_2$ gas under molecular flow condition for duration of replacing the metal inorganic/organic compound layer to the metal oxide layer.

When aluminum or titanium compounds are used as the metal inorganic/organic compound, aluminum oxide or titanium oxide layers respectively is grown as the insulation layer.

Details of other modifications will become clear from a reading of the detailed description of the invention with reference to the drawings.

BRIEF DESCRIPTION OF THE DRAWINGS

FIGS. 6 (a) and 6 (b) show test results on withstanding voltage between gate electrode and source/drain electrode of a TFT, wherein

Same or like reference numerals designate same or corresponding parts throughout the drawings.

DETAILED DESCRIPTION OF THE PREFERRED EMBODIMENTS

Figure 1:
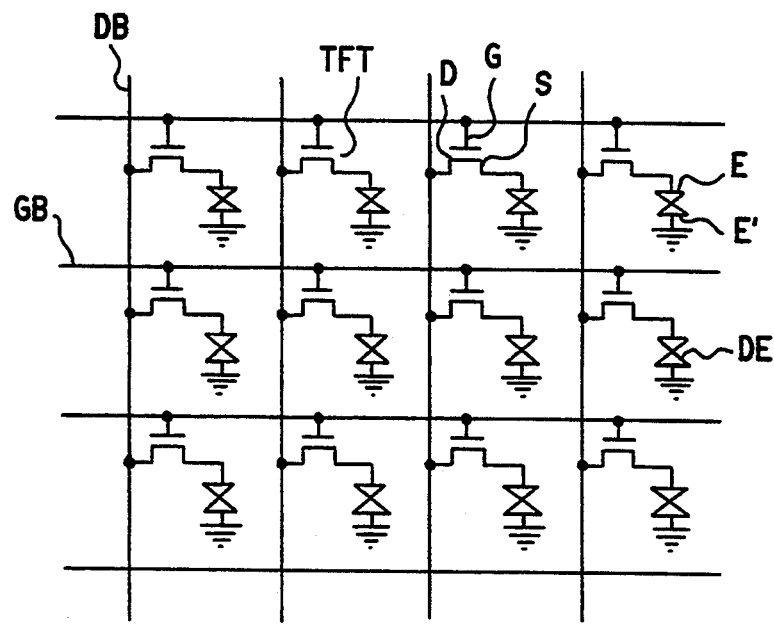
FIG. 1 shows a partial equivalent circuit of an active matrix display device for explaining a general concept of the device structure.

FIG. 1 shows a partial equivalent circuit of an active matrix display device,for explaining a general concept of the device structure. A plurality of display elements DE are arranged in rows and columns comprising a first transparent electrode E formed on a first substrate and a second transparent electrode E' on a second substrate and light influencing material such as liquid crystal therebetween. A plurality of thin film transistors (TFTs) are formed on the first substrate at each corresponding position of the display elements DE. Each TFT comprises gate electrode G, source electrode S and drain electrode D. A plurality of gate bus lines GB are formed on the first substrate connecting gate electrodes G in the row direction and a plurality of drain bus lines are also formed on the first substrate connecting drain electrodes D in the column direction, the drain bus lines DB being insulated from the gate bus lines GB.

Figure 2:
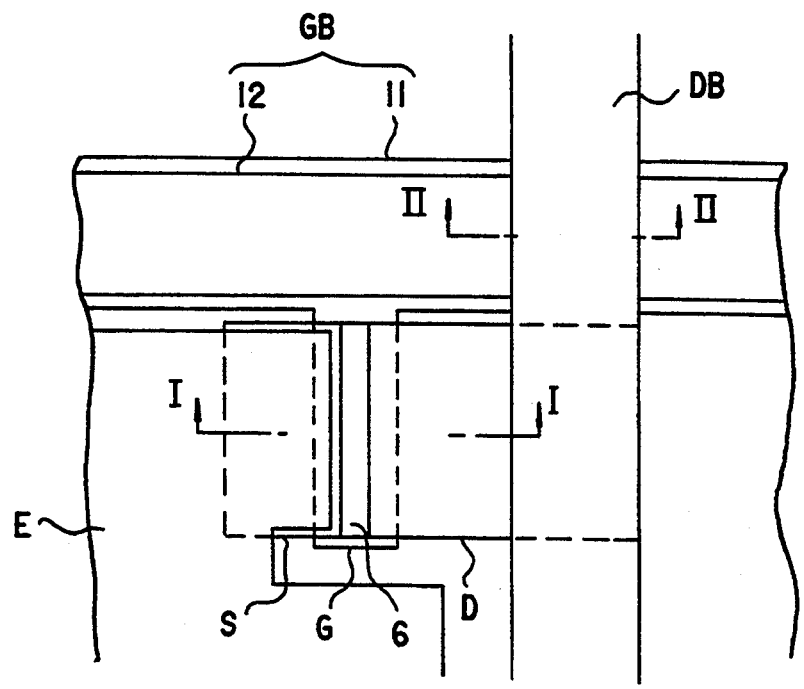
FIG. 2 shows an enlarged top view of a first substrate around a TFT forming region of an active matrix display device in accordance with the present invention.
Figure 3:
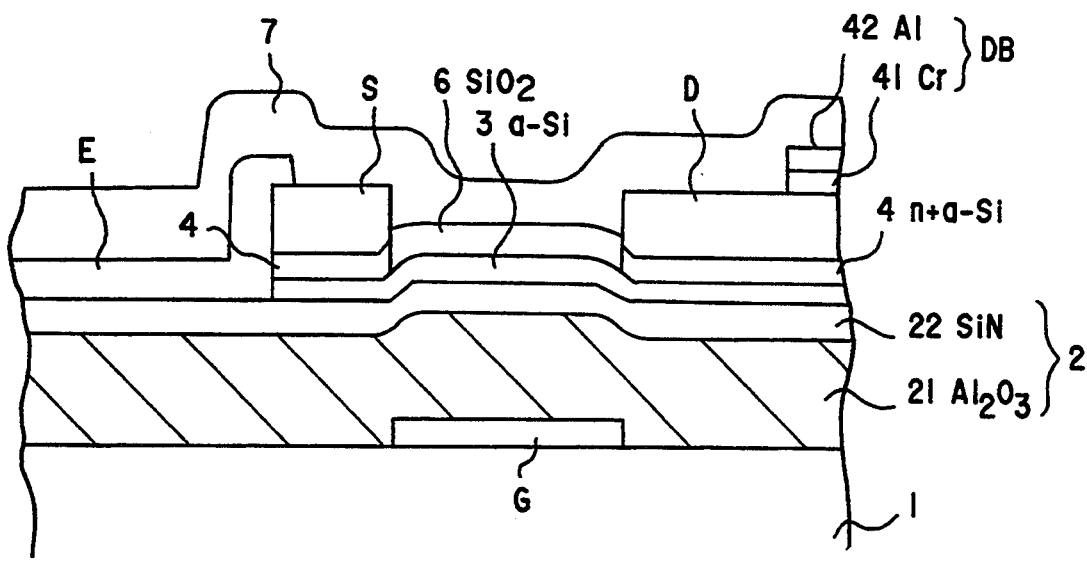
FIG. 3 is a cross sections along line I—I of FIG. 2.
Figure 4:
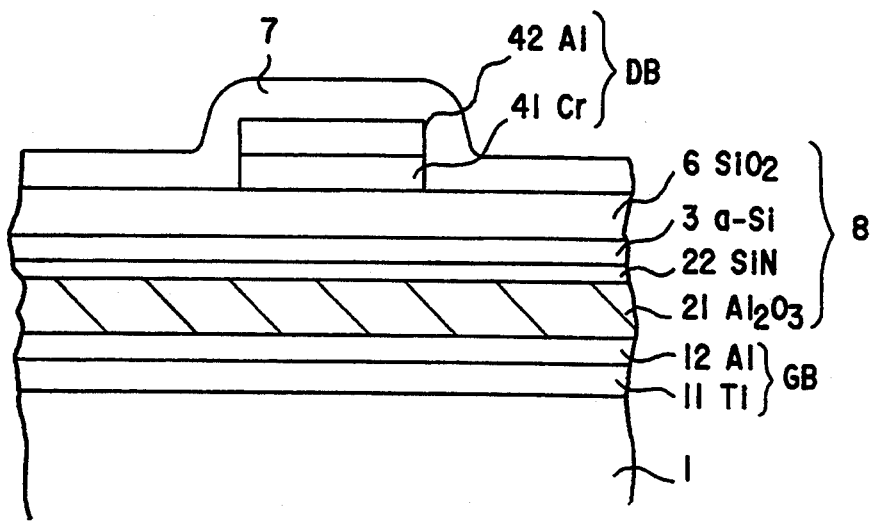
FIG. 4 is a cross sections along line II—II of FIG. 2.

FIG. 2 shows an enlarged top view of a first substrate 1 around a TFT forming region, and FIGS. 3 and 4 are cross sections along lines I—I and II—II respectively of FIG. 2.

A manufacturing method of forming a gate insulation layer and inter-busline insulation layer in accordance with the present invention is explained using these FIGS. 2 to 4. On the transparent substrate 1 of an insulating material such as glass, a titanium layer is deposited and patterned, resulting in forming gate electrodes G in FIG. 3. Thereby a lower layer 11 of gate bus lines GB of FIG. 4 is formed at the same time. On the lower layer 11 of the gate bus lines GB, an upper layer 12 of aluminum is further deposited and patterned. The aluminum layer 12 of gate bus lines may be deposited and patterned before the titanium deposition for gate electrodes G.

Next, an insulation layer 2 including a lower layer 21 and an upper layer 22, is formed on an entire surface of the substrate 1. In the TFT region, it is used as a gate insulation layer 2 in FIG. 3. At crossing points of the gate bus lines GB with drain bus lines DB in FIG. 4, the insulation layer 2 is used as constituent layer of an inter-busline insulation layer 8. The existing technology generally utilizes silicon oxide ($SiO_2$) as the material of the lower insulation layer 21. However, in the present invention, the lower insulation layer 21 is of aluminum oxide (alumina, $Al_2O_3$) and formed by the ALE method, and the upper insulation layer 22 may be either of silicon nitride (SiN) formed by a plasma CVD method, or of aluminum nitride (AlN) formed by the ALE method. However, the use of silicon nitride (SiN) by the plasma CVD method is more advantageous because the subsequent deposition of amorphous silicon can be performed using the same plasma CVD apparatus without interruption.

Figure 5:
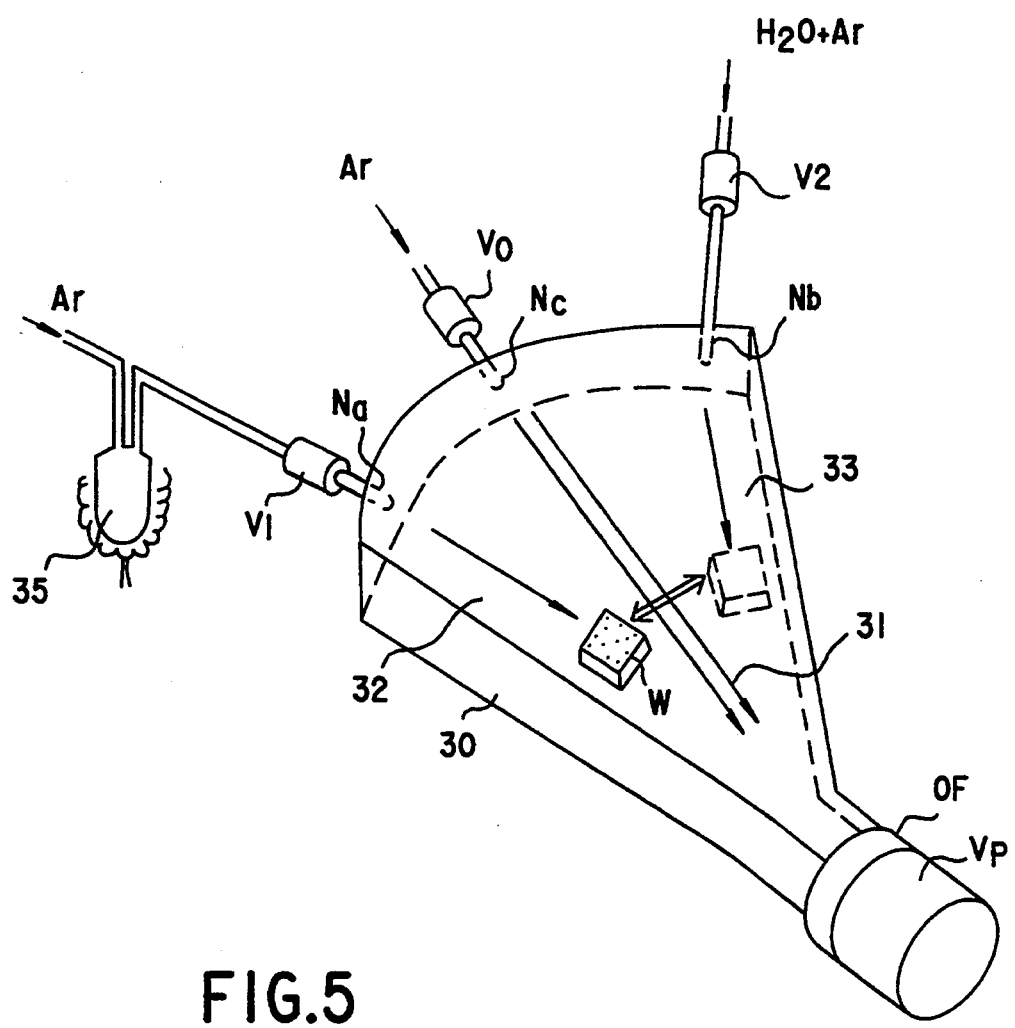
FIG. 5 shows schematically an apparatus for growing an insulation layer by the ALE method in accordance with the present invention.

Herein, the ALE method used in the present invention is first explained. The $Al_2O_3$ insulation layer 21 deposited by the ALE method can be obtained using an apparatus which is schematically shown in FIG. 5. Hereinafter, the apparatus of this type is called conveniently ALE apparatus. The apparatus comprises a reaction chamber 30 of a fan-shaped type, which is exhausted by a turbo-molecular pump Vp and the pressure in which is controlled by an orifice valve OF. At the middle portion of the arc-shaped fringe, a gas inlet Nc is provided which spouts argon (Ar) gas into the reaction chamber 30. The direction of Ar gas flow is substantially coincident with the center line of the reaction chamber. The Ar gas flow forms a gas barrier 31 dividing the reaction chamber 30 into two. On both sides of the gas barrier 31, a pair of gas inlets Na and Nb are provided. Source gases are supplied into the reaction chamber 30 from these gas inlets Na and Nb. A substrate W, a thin film being deposited thereon, moves back and forth as shown by an arrow from a first position in region 32 to a second position in region 33 and vice versa. The region 32 is solely under the influence of the gas from the inlet Na, and the region 33, the gas from the inlet Nb.

Next, a method of forming a thin $Al_2O_3$ layer using the ALE apparatus is explained. A substrate is mounted on a stage (not shown) which can move from region 32 to region 33, and is heated to 300° C. The reaction chamber is exhausted to a vacuum degree of about $5 \times 10^{-7}$ Torr by the turbo-molecular pump Vp. A valve $V_0$ is opened and Ar gas is made to flow into the reaction chamber through the inlet Nc at a flow rate of about 500 sccm, the flow rate being controlled by a mass flow controller (not shown). Further, the orifice valve OF is controlled to maintain the pressure inside the reaction chamber 30 at about 0.01 Torr.

Next another valve $V_1$ is opened and Ar gas is made to flow through a bubbling cylinder 35 of aluminum chloride ($AlCl_3$) and further through the inlet Na. Because the bubbling cylinder 35 is heated to about 110° C., aluminum chloride vapor is introduced in the region 32.

Next, another valve $V_2$ is opened and water ($H_2O$) vapor and/or oxygen ($O_2$) gas from a bubbling cylinder (not shown) which is maintained at a temperature of 20° C. is introduced with argon gas into the region 33 of the reaction chamber 30. The aluminum chloride gas in the region 32 will not mix with the water vapor in the region 33, because the argon gas barrier 31 prevents the mixing of these two gases. The vapor or gas pressure in the reaction chamber 30 during the process is always maintained at about 0.01 Torr.

Providing the above gas flow conditions for the ALE apparatus, the substrate 1 is moved from region 32 to region 33 and further back to region 32 with a period of about 3 seconds. During the first half of the period, an aluminum chloride layer is deposited with a thickness of substantially equal to or less than a single atomic layer, and during the second half of the period, the aluminum chloride ($AlCl_3$) layer is converted to an aluminum oxide ($Al_2O_3$) layer due to the following chemical reaction.

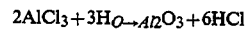

$$2AlCl_3 + 3H_2O \rightarrow Al_2O_3 + 6HCl$$

The above movement is repeated about 6,000 times, which results in forming the thin aluminum oxide layer 21 having a thickness of approx. 4,000 Å.

Returning to the explanation on FIGS. 2 through 4, the upper insulation layer 22 of silicon nitride (SiN) is formed on the aluminum oxide layer 21 using a plasma CVD apparatus. The thin silicon nitride layer 22 has a thickness of about 200 Å and is formed with the object of improving an interface condition with an amorphous silicon semiconductor layer 3, which is to be deposited immediately after the formation of the silicon nitride layer 22 using the same plasma CVD apparatus.

The silicon nitride layer 22 and the amorphous silicon layer 3, both layers being formed by the same plasma CVD apparatus without interruption, contribute to improve electrical characteristics due to the interface condition between two layers and to prevent an abnormal circular growth of amorphous silicon, which is often observed when the amorphous silicon is directly deposited on the aluminum oxide layer 21.

In the embodiment, the gate insulation layer 2 is a double layer of the aluminum oxide layer 21 and silicon nitride layer 22. This double layer is simultaneously formed on the gate bus line GB of FIG. 4 as constituent layers of an inter-busline insulation layer 8. However, the silicon nitride layer 22 and other layers such as amorphous silicon layer 3 and silicon oxide layer 6 in FIG. 4 are required for the TFT only. Therefore, if the inter-busline insulation layer 8 is formed separately by independent processes, the inter-busline insulation layer may be a single layer of the aluminum oxide layer 21.

After forming the silicon nitride layer 22, the amorphous silicon layer 3 and a silicon oxide ($SiO_2$) layer 6 are continuously deposited on the entire surface of the substrate using the same plasma CVD apparatus. There is no need of taking the substrate out of the apparatus during these processes.

In the TFT region, the amorphous silicon layer 3 and silicon oxide layer 6 are patterned, and thereafter, a contact layer 4 of doped amorphous silicon (n+a-Si:H) 4 and a source electrode S and a drain electrode D, both being of titanium, are formed.

In FIGS. 3 and 4, a chromium (Cr) layer 41 and an aluminum layer 42 are deposited and patterned, resulting in connecting a plurality of drain electrodes D in the column direction and forming drain bus lines DB on the silicon oxide layer 6. A display electrode E of thin transparent indium tin oxide (ITO) film is also formed on the silicon nitride layer 22 and patterned having a connection to each source electrode S.

The method of forming an insulation layer in accordance with the present invention can be applied for forming another insulation layer i.e. a protection layer formed on an entire surface of the substrate 1. The protection layer 7 is of aluminum oxide and is formed by the same ALE method. In forming the protection layer 7, in which the TFT is already formed on the substrate, the substrate temperature can not be raised up to the temperature used in the forming the $Al_2O_3$ layer 21 previously applied. Excess temperature deteriorates voltage-current characteristics of the TFT and makes a switching voltage thereof to increase. Existing methods of forming silicon nitride layer or silicon oxide layer utilize the known plasma CVD method, in which a growth temperature is forcibly reduced to an enough low temperature, has a drawback of inferior density of the deposited layer and is unsatisfactory for protecting the TFT.

In this embodiment, the substrate is maintained at a temperature as low as 200° C. In the similar way, the substrate is exposed to the aluminum chloride vapor and the water vapor alternately in the ALE apparatus. The similar process is repeated for 6,000 cycles with the result of obtaining the aluminum oxide ($Al_2O_3$) layer of 4,000 Å thickness. When the formation of the protection layer 7 is finished, all processes for the first substrate 1 is completed.

The embodied substrate of the active matrix display device in accordance with the present invention comprises the gate insulation layer 2, inter-busline insulation layer 8 and protection layer 7 grown by the ALE method. These insulation layers are high in density and have a close adhesion characteristic to the lower underlying layer and good coverage over the steps of the underlying layer and a high insulation characteristic. Further, the protection layer 7 is formed at the sufficient low temperature, therefore, the TFT formed on the substrate shows no deterioration in characteristic and the switching voltage thereof is very low.

Figure 6A:
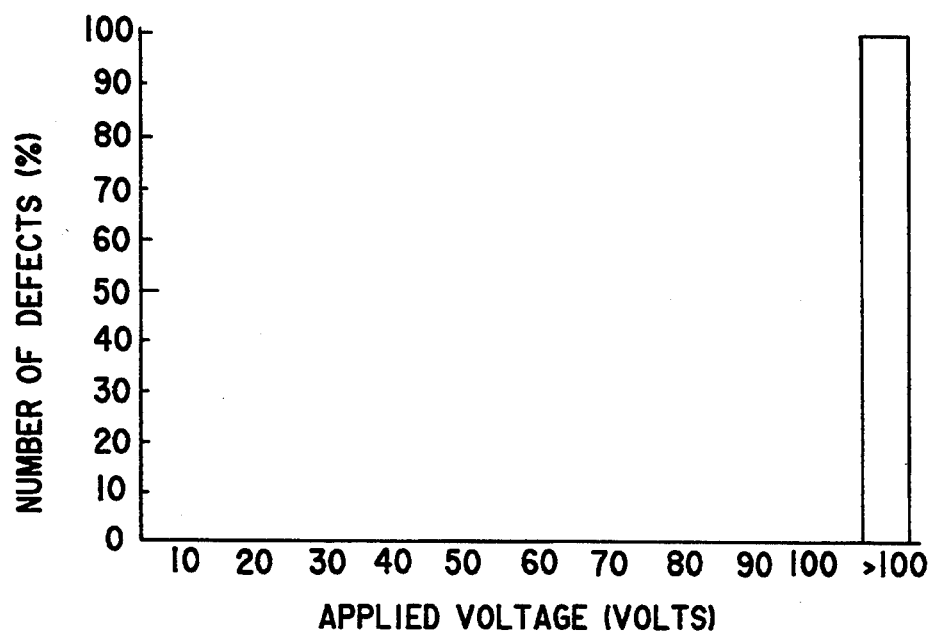
FIG. 6(a) shows the data obtained for the TFTs comprising the gate insulation layer formed in accordance with the present invention and FIG. 6(b) shows the data for the TFTs produced by the existing known technology.
Figure 6B:
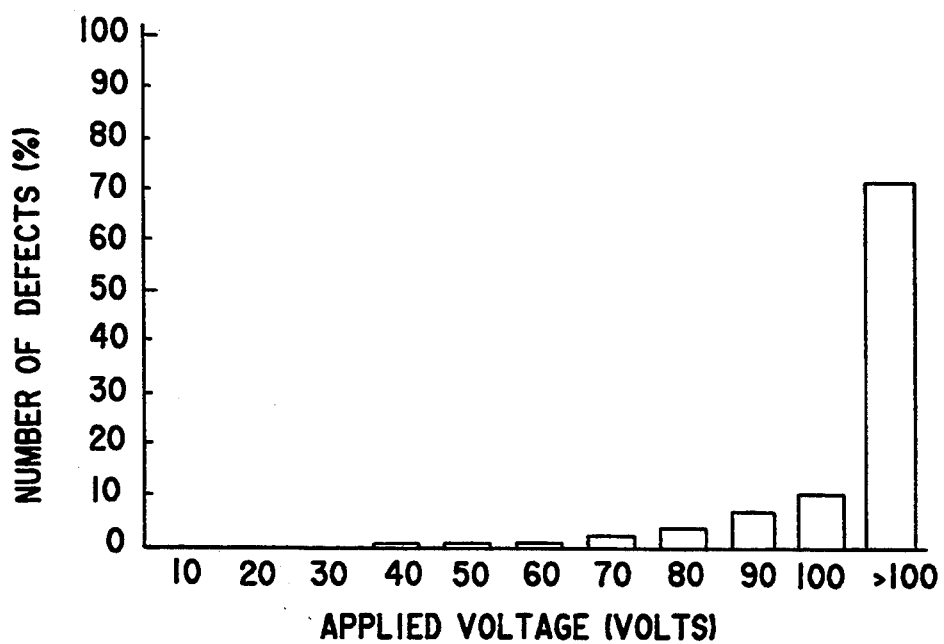

For example, FIGS. 6(a) and 6(b) show test results of withstanding voltage between the gate electrode and source/drain electrode of the TFT. FIG. 6(a) shows the data obtained for the TFTs comprising the gate insulation layer applying the present invention. FIG. 6(b) shows the data for the TFTs produced by the conventional CVD technology. In both Figures, the abscissa shows the applied voltage and the ordinate shows the number of gate bus lines GB having a defect in percentage, the defect being caused by any one of TFTs having a break down (can not withstand the applied voltage within a specified range) connected in the row direction. The data show that, when the gate insulation layer is formed in accordance with the present invention, there is no defect of TFTs in the range less than 100 volts of withstanding voltage.

Figure 7:
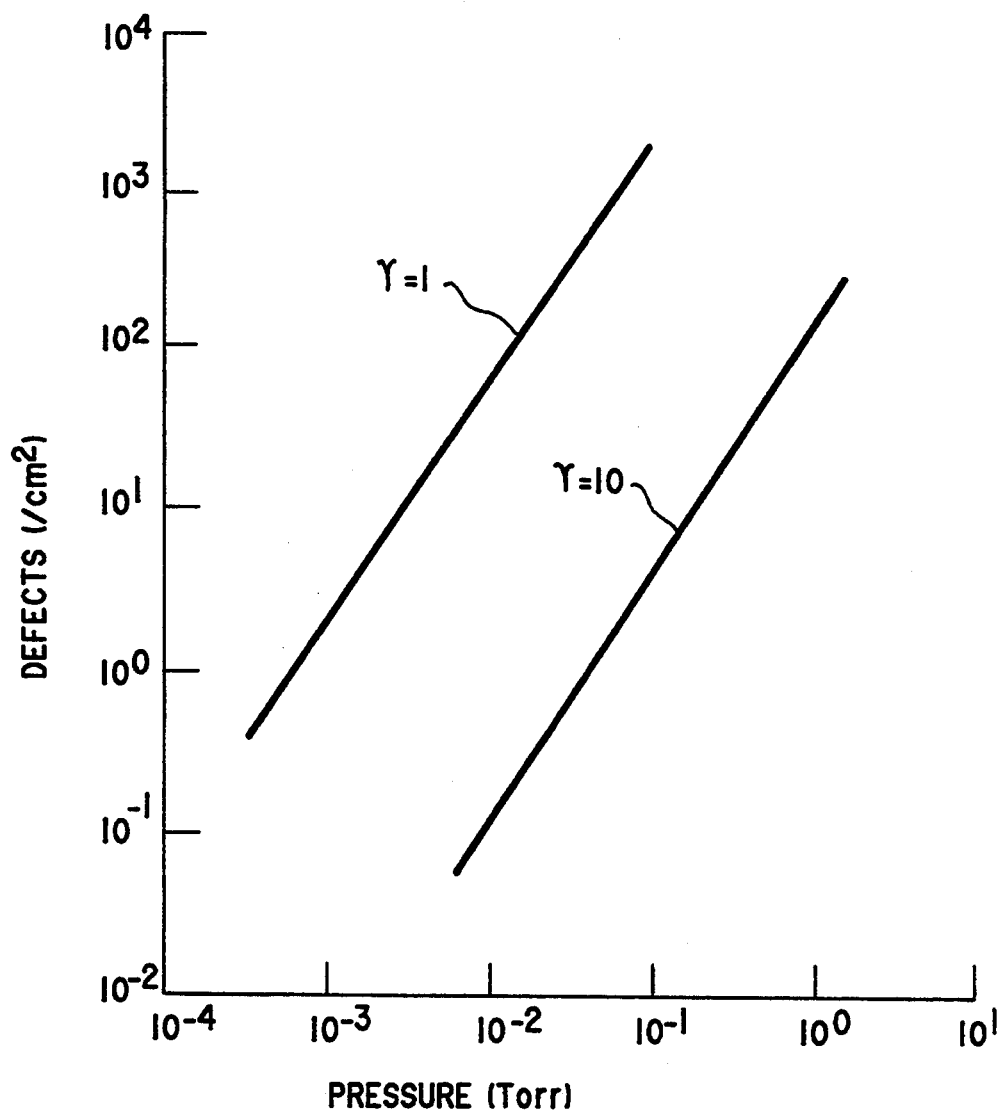
FIG. 7 is a graph showing the test results on a relation between vapor pressure inside a reaction chamber and the number of defects per unit area of an insulation layer when gas flow conditions in the ALE apparatus of FIG. 5 are changed.

FIG. 7 shows the relation between the vapor pressure inside the reaction chamber and the number of defects per unit area of an insulation layer, and two curves in FIG. 7 are measured by changing a parameter r, which is the ratio of flow rate of barrier gas to total flow rate of source gases. As can be seen from FIG. 7, the lower the vapor pressure is, the less the number of defects is. This means that a magnitude of the mean free path of source gas molecules will affect the quality of the formed insulation layer. According to the present invention, the vapor flow in the reaction chamber is preferable to be under the condition of molecular flow. Under this condition, the mean free path of the gas molecules is long enough and very few of gas molecules flying toward the substrate collide with other molecules and there is very little chance to form a cluster of gas molecules. As a result, the deposition on the substrate is uniform and there is no nucleus for an abnormal growth of molecules on the substrate. The deposited layer has a good adhesion characteristic to the lower underlying layer and is flawless.

When the vapor pressure is decreased to 0.01 Torr, the number of defects is improved three orders smaller than the number at vapor pressure of 1 Torr. However, it is impractical to use vapor pressure of less than 0.001 Torr, because the growth rate of the deposited layer becomes too low. Therefore, it is preferable to use 1 to several tens, of milli Torr in the present invention. Further, FIG. 7 also shows that the larger the parameter r is, the less the number of defects is. This demonstrates that the barrier gas 31 in FIG. 5 plays an important role to prevent the mixture Of two source gases in regions 32 and 33.

In the embodiments in forming aluminum oxide layer by the ALE method, an aluminum chloride gas ($AlCl_3$) is utilized as a first source gas. Other inorganic/organic aluminum compound gases such as aluminum bromide ($AlBr_3$), organoaluminum compound such as trimethylaluminum [$Al(CH_3)_3$] and triethylaluminum [$Al(C_2H_5)_2cl$] may organoaluminum chloride such as dimethylaluminum chloride [$Al(CH_3)_2Cl$] and diethylaluminum chloride [$Al(C_2H_5)_2Cl$] may be used as the source gas.

When the first source gas ($AlCl_3$) is changed to titanium chloride gas ($TiCl_4$ or $TiCl_3$) or titanium bromide ($TiBr_4$) gas and a substrate is subjected to the similar steps as explained with regard to FIG. 5, an insulation layer of titanium oxide ($TiO_2$) can be grown on the substrate. $TiO_2$ has a larger dielectric constant than that of $Al_2O_3$. When a $TiO_2$ layer is used for the gate insulation layer, a switching voltage of the TFT can be decreased.

If the ALE growth of $Al_2O_3$ and the ALE growth of $TiO_2$ are repeated alternately, each growth being substantially equivalent to or less than a single atomic layer growth, a composite insulation layer of $Al_2O_3$ and $TiO_2$ can be obtained, which has a larger dielectric constant than that of $Al_2O_3$ and a higher insulation characteristic than that of $TiO_2$. The growth of the composite layer can be performed by changing the source gas from aluminum chloride to titanium chloride gas source alternately, whereby the latter gas source is additionally provided and connected to the valve $V_1$ in FIG. 5.

In the previous explanation for forming the gate insulation layer 2, a silicon nitride layer is used as the upper insulation layer 22. Replacing the silicon nitride layer, an aluminum nitride (AlN) layer can be used as the upper insulation layer. The ALE apparatus of FIG. 5 can be used for growing the AlN layer. When the source gas supplied to the valve $V_2$ is changed to an ammonia ($NH_3$) gas source and other gas supply arrangements and processes are the same as previously explained, the aluminum nitride layer can be grown.

In order to improve picture quality of an active matrix display device, it is known that an auxiliary capacitor is effective, which is provided at each position of display elements and is inserted in parallel with the display element.

Figure 8:
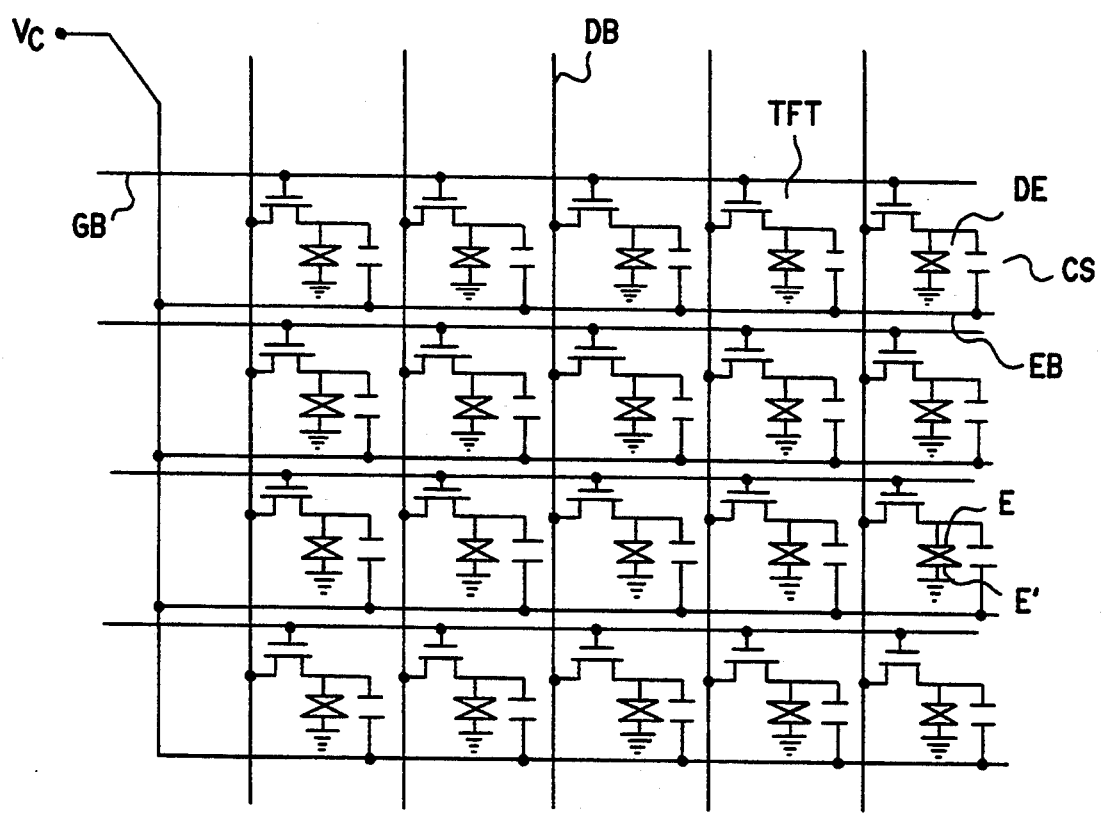
FIG. 8 shows an equivalent circuit of an active matrix display device, wherein an auxiliary capacitor is formed at each position of display elements.

FIG. 8 shows an equivalent circuit of this type of a display device. When FIG. 8 is compared with the conventional equivalent circuit of FIG. 1, it is seen that an auxiliary capacitor Cs is added. A first capacitor electrode is connected to a first transparent display electrode E, and a second capacitor electrode is connected to an earth bus line EB which connects a plurality of second capacitor electrodes in the row direction on a substrate. In an actual design, the first display electrode E is used in common as the first capacitor electrode, and the earth bus line EB is formed separately on the substrate and a portion thereof is used as the second capacitor electrode. These two capacitor electrodes and a capacitor insulation layer therebetween forms the capacitor Cs. The earth bus lines EB are separately formed on the substrate, because these lines are to be insulated from gate bus lines GB and drain bus lines DB on the substrate.

Figure 9A:
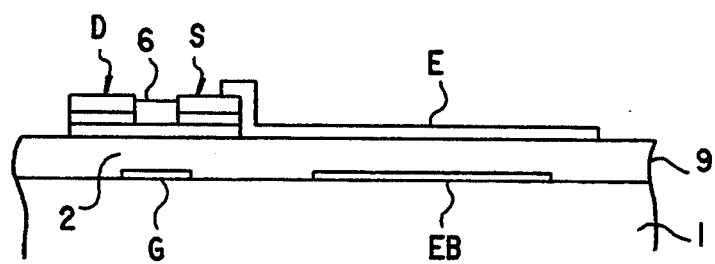
FIGS. 9(a) and 9(b) show a cross section of a substrate for two types when an auxiliary capacitor is formed by the ALE method in accordance with the present invention.
Figure 9B:
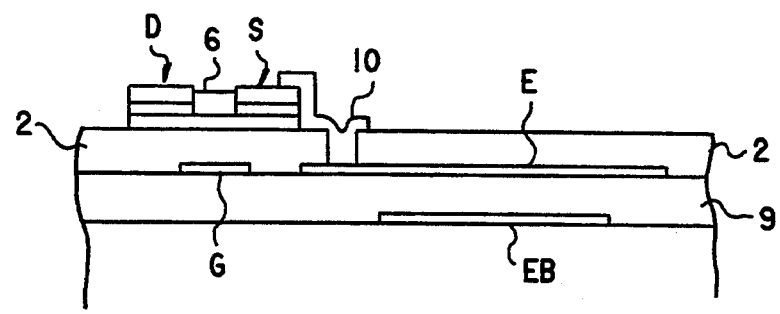
Figure 10A:
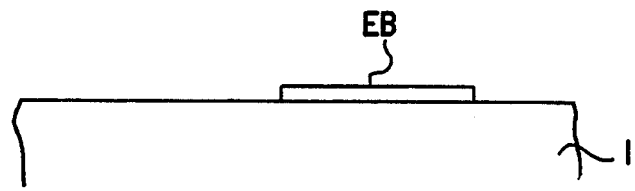
FIGS. 10(a) through 10(d) show a cross section of a substrate at successive steps in forming an auxiliary capacitor and a TFT by the ALE method of the present invention.
Figure 10B:
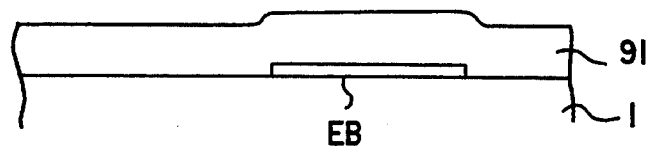
Figure 10C:
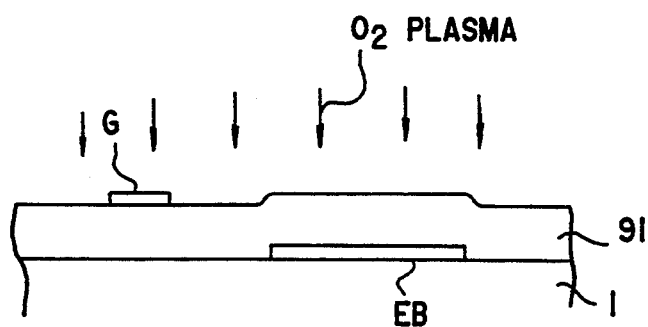
Figure 10D:
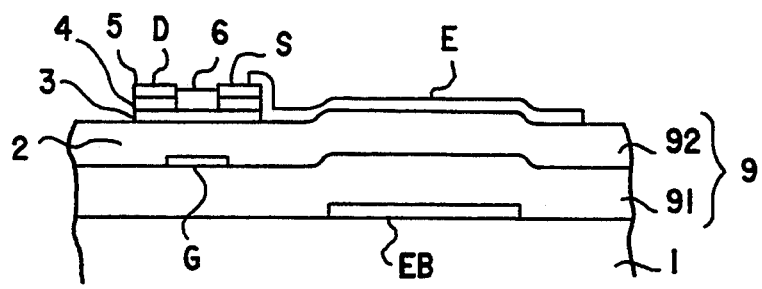

FIGS. 9(a), 9(b) and 10(d) show a cross section of substrates with capacitor Cs and TFT for three different types. In FIG. 9(a), a gate electrode G and a second capacitor electrode EB (earth bus line) are formed directly on a substrate 1. A gate insulation layer 2 is used in common as a capacitor insulation layer 9

In FIG. 9(b), a second capacitor electrode EB is first formed on a substrate 1, however, a gate electrode G is formed on a capacitor insulation layer 9. A transparent display electrode E is also formed on the capacitor insulation layer 9.

In FIG. 10(d), a transparent display electrode E is formed on a double layer 9 of first and second insulation layers 91 and 92. This type eliminates an additional process of forming a connector 10 used in FIG. 9(b).

Generally, the second capacitor electrodes EB (earth bus lines) are made of indium tin oxide (ITO), because electrodes EB are required to be transparent. ITO has rather a high resistivity as an electrical conductor, therefore, the thickness of the earth bus lines EB are preferable to be larger in order to reduce the resistance thereof.

With regard to the structure of FIG. 9(a), the earth bus lines EB should be formed with stripe pattern, each earth bus line running in the row direction and being connected with other bus lines at the end portion. This is because the earth bus line EB can not cross gate bus lines formed on the same level. Therefore, the electrical resistance of each earth bus line EB can not be reduced to a sufficient low level. On the other hand, earth bus lines of FIGS. 9(b) and 10(d) are formed on the lower level independently on the substrate. There is no grade crossing with gate bus lines. The earth bus lines EB can be connected in both row and column directions, resulting in sufficient reduction of electrical resistance of all earth bus lines EB.

The capacitor insulation layers 9 used in FIGS. 9(a), 9(b) and 10(d) are required to have a good covering effect over steps formed by underlying layer surface and to have a high density as the insulation material and further preferably to have no flaw in the insulation layer.

The method of forming insulation layer in accordance with the present invention meet well these requirements. In forming the capacitor insulation layer 9 of FIG. 9(a), the gate insulation layer 2 of aluminum oxide layer 21 and silicon nitride layer 22 of FIG. 3, can be used therefor without change. The capacitor insulation layer 9 of FIG. 9(b) is of aluminum oxide ($Al_2O_3$) layer and can be formed utilizing the same method as used in forming the aluminum oxide layer 21 of FIGS. 3 and 4.

An example of manufacturing processes of the auxiliary capacitor is explained using FIGS. 10(a) through 10(d). An earth bus line EB (second capacitor electrode) of ITO is deposited on a substrate 1 and patterned as shown in FIG. 10(a). Utilizing the ALE method of the present invention, an aluminum oxide ($Al_2O_3$) thin layer 91 (capacitor insulation layer) is grown until the thickness of 4,000 Å can be obtained as shown in FIG. 10(b). In FIG. 10(c), a gate electrode G of titanium having a thickness of about 800 Å and gate bus lines (not shown) are formed on the aluminum oxide layer 91. Thereafter, the surface of the substrate is subjected to an oxygen ($O_2$) plasma process, which has effects of removing remainder of resist material and oxidizing titanium surface of the gate electrode G.

In FIG. 10(d), a gate insulation layer 2 and a second capacitor insulation layer 92 are formed on the substrate of FIG. 10(c). These insulation layers are of a double layer of silicon oxide ($SiO_2$) of about 1,000 Å in thickness and silicon nitride (SiN) of about 2,000 Å in thickness. The double insulation layer 92 and the aluminum oxide layer 91 in the capacitor forming region form the capacitor insulation layer 9. An amorphous silicon (a-Si:H) layer 3 of about 150 Å in thickness and a silicon oxide or nitride ($SiO_2$ or SiN) layer 6 of about 1,400 Å in thickness are deposited by a plasma CVD method and patterned. The growth processes of the double insulation layer 2 and 92, amorphous silicon layer 3 and silicon oxide layer 6 can be performed continuously using the same plasma CVD apparatus, during which the substrate does not need to be taken out of the apparatus.

Further, a doped amorphous silicon (n+a-Si:H) layer 4, and source and drain electrodes S and D of titanium are deposited and patterned, with a result of forming a TFT. Finally, a display electrode E of ITO is formed on the insulation layer 9.

The auxiliary capacitor Cs in the active matrix display device of the present invention comprises at least an aluminum oxide layer in the capacitor insulation layer 9, the aluminum oxide layer being formed by the ALE method of the present invention. Even when the earth bus line EB has enough thickness with steep steps, the capacitor insulation layer shows a high insulation characteristic, which reduces defects due to current leakage between capacitor electrodes.

The method can be embodied in other capacitor structures of display devices than those described above.

In the embodiments, an insulation layer manufactured by the ALE method of the present invention is applied for forming gate insulation layer, inter-busline insulation layer, protection layer and capacitor insulation layer in the active matrix display device. The present invention may be embodied in other specific types without departing from the spirit or essential characteristics thereof.

The disclosed embodiments have the structures such that gate electrode is first formed on a substrate and that insulation layer, active semiconductor layer, and source and drain electrodes are subsequently formed in this order (called conventionally inverted staggered type), however, the present invention may be embodied in a normal type (staggered type) active matrix display device, in which the above deposition sequence is inverted.

Further, this invention may be embodied in an active matrix display device for forming a gate insulation layer, wherein gate bus lines and data bus lines are separately formed on first and second substrates respectively and each drain electrode is connected to an adjacent gate bus line. This type of the display device is disclosed in U.S. Pat. No. 4,818,981 issued on Apr. 4, 1989 by the same Applicant.

The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

An insulation layer in accordance with the present invention is superior in quality and has very few defects. The steps of the underlying surface are well covered by the formed insulation layer. Further, the insulation layer can be formed at comparatively low temperatures. Active matrix display devices manufactured in accordance with the present invention show a high reliability, a high withstanding voltage, and a high picture quality.

What is claimed is:

1. A method of manufacturing an active matrix display device, comprising first and second substrates forming an enclosure, a plurality of display elements arranged in rows and columns, each display element comprising first and second transparent electrodes formed on inside surfaces of the first and second substrates respectively and light influencing material therebetween, a plurality of thin film transistors formed on the first substrate, the thin film transistor located at each corresponding position of the display elements and having a gate electrode, a gate insulation layer, a semiconductor layer, and source and drain electrodes, and at least gate bus lines formed on the first substrate for driving the display elements through the thin film transistors, the gate bus line connecting the gate electrodes located in the row direction, said manufacturing method comprising the steps of forming the gate insulation layer of the thin film transistor:

(a) providing a reaction chamber comprising first and second gas inlets and a barrier gas inlet, an outlet for exhausting these gases and means for transferring a substrate between first and second positions within said reaction chamber and flowing the first and second gases and the barrier gas, wherein the first and second gas inlets and the barrier gas inlet and the gas outlet are arranged such that only the barrier gas flow separates the first and second gases under a condition of molecular flow and defines said first and second positions, and such that the substrate at the first position is exposed to the first gas and the substrate at the second position is exposed to the second gas under the condition of molecular flow;

(b) disposing said first substrate at the first position and subjecting it to the first gas of a metal inorganic/organic compound, which can react with $H_2O$ and/or $O_2$ and form the metal oxide under the condition of molecular flow, the gas pressure in the reaction chamber ranging between 1 and several tens of milli-Torr, for a duration of depositing almost a single atomic layer;

(c) transferring said first substrate to the second position and subjecting the surface of a metal inorganic/organic compound layer formed in step (b) to the second gas of the $H_2O$ gas and/or $O_2$ gas under the condition of molecular flow, the gas pressure in the reaction chamber ranging between 1 and several tens of milli-Torr, for a duration of replacing the metal inorganic/organic compound layer to the metal oxide layer; and (d) repeating the steps (b) and (c) alternately for plural cycles until a specified thickness of the metal oxide layer is grown.

2. A method of manufacturing an active matrix display device as recited in claim 1, wherein said active matrix device further comprises source/drain bus lines connecting a plurality of source/drain electrodes in the column direction and formed on the first substrate.

3. A method of manufacturing an active matrix display device as recited in claim 1, wherein said method of forming the thin film transistor further comprises the following previous and subsequent steps of:

forming the gate electrode of conductive material on the first substrate before forming said gate insulation layer; and depositing an amorphous silicon semiconductor layer on said formed gate insulation layer by a plasma CVD method.

4. A method of manufacturing an active matrix display device as recited in claim 1, wherein said method of forming the thin film transistor further comprises the step (d) after said step (c):

(d) depositing a second gate insulation layer of silicon nitride on said gate insulation layer by a plasma CVD method.

5. A method of manufacturing an active matrix display device as recited in claim 1, wherein said metal inorganic/organic compound used in the step (a) is anyone or a combination selected from either the group of aluminum chloride, aluminum bromide, trimethylaluminum, triethylaluminum, dimethylaluminum chloride and diethylaluminum chloride for growing aluminum oxide, or the group of titanium chloride and titanium bromide for growing titanium oxide.

6. A method of manufacturing an active matrix display device, the device comprising first and second substrates forming an enclosure, a plurality of display elements arranged in rows and columns, each display element comprising first and second transparent electrodes formed on inside surfaces of the first and second substrates respectively and light influencing material therebetween, a plurality of thin film transistors formed on the first substrate, the thin film transistor located at each corresponding position of the display elements and having a gate electrode, a gate insulation layer, a semiconductor layer, and source and drain electrodes, gate bus lines and source/drain bus lines formed on the first substrate for driving the display elements through the thin film transistors, the gate bus line connecting the gate electrodes located in the row direction and the source/drain bus line connecting the source/drain electrodes in the column direction and the gate and source/drain bus lines being insulated from each other by an inter-busline insulation layer at each intersection, said manufacturing method comprising the following steps of forming the inter-busline insulation layer:

providing a reaction chamber comprising first and second gas inlets and a barrier gas inlet, an outlet for exhausting these gases and means for transferring a substrate between first and second positions within said reaction chamber and flowing the first and second gases and the barrier gas, wherein the first and second gas inlets and the barrier gas inlet and the gas outlet are arranged such that only the barrier gas flow separates the first and second gases under a condition of molecular flow and defines said first and second positions, and such that the substrate at the first position is exposed to the first gas and the substrate at the second position is exposed to the second gas under the condition of molecular flow;

depositing the inter-busline insulation layer on the gate bus lines by a method which comprises performing a specified number of repeated cycles of disposing the first substrate at the first position and subjecting it to the first gas of a metal inorganic/organic compound, which can react with $H_2O$ and/or $O_2$ and form the metal oxide under the condition of molecular flow, the gas pressure in the reaction chamber ranging between 1 and several tens of milli-Torr, for a duration of depositing almost a single atomic layer, and transferring said first substrate to the second position, and subjecting the surface of the thus formed metal inorganic/organic compound layer to the second gas of the $H_2O$ gas and/or $O_2$ gas under the condition of molecular flow, the gas pressure in the reaction chamber ranging between 1 and several tens of milli-Torr, for a duration of replacing the metal inorganic/organic compound layer to the metal oxide layer; and forming the source/drain bus lines on the inter-busline insulation layer.

7. A method of manufacturing an active matrix display device as recited in claim 6, wherein said method of forming the inter-busline insulation layer further comprises the step of depositing a second inter-busline insulation layer of silicon nitride on said inter-busline insulation layer by a plasma CVD method before the step of forming the source/drain bus lines.

8. A method of manufacturing an active matrix display device as recited in claim 6, wherein said metal inorganic/organic compound in the depositing step of the inter-busline insulation layer is anyone or a combination selected from either the group of aluminum chloride, aluminum bromide, trimethylaluminum, triethylaluminum, dimethylaluminum chloride and diethylaluminum chloride for growing aluminum oxide, or the group of titanium chloride and titanium bromide for growing titanium oxide.

9. A method of manufacturing an active matrix display device as recited in claim 6, wherein said depositing step of the inter-busline insulation layer is the common step for depositing the gate insulation layer.

10. A method of manufacturing an active matrix display device, comprising first and second substrates forming an enclosure, a plurality of display elements arranged in rows and columns, each display element comprising first and second transparent electrodes on inside surfaces of the first and second substrates respectively and light influencing material therebetween, a plurality of thin film transistors formed on the first substrate, the thin film transistor located at each corresponding position of the display elements and having a gate electrode, a gate insulation layer, a semiconductor layer, and source and drain electrodes, gate bus lines and source/drain bus lines formed on the first substrate for driving the display elements through the thin film transistors, the gate bus line connecting the gate electrodes located in the row direction and the source/drain bus line connecting the source/drain electrodes in the column direction, said device further comprising a protection layer at least on the thin film transistor region, said manufacturing method comprising the following steps of forming the protection layer:

providing a reaction chamber comprising first and second gas inlets and a barrier gas inlet, an outlet for exhausting these gases and means for transferring a substrate between first and second positions within said reaction chamber and flowing the first and second gases and the barrier gas, wherein the first and second gas inlets and the barrier gas inlet and the gas outlet are arranged such that only the barrier gas flow separates the first and second gases under a condition of molecular flow and defines said first and second positions, and such that the substrate at the first position is exposed to the first gas and the substrate at the second position is exposed to the second gas under the condition of molecular flow;

forming the thin film transistors on the first substrate; and depositing the protection layer on the thin film transistors by a method which comprises performing a specified number of repeated cycles of disposing the first substrate at the first position and subjecting it to the first gas of a metal inorganic/organic compound, which can react with $H_2O$ and/or $O_2$ to form the metal oxide under the condition of molecular flow, the gas pressure in the reaction chamber ranging between 1 and several tens of milli-Torr, for a duration of depositing almost a single atomic layer, and transferring said first substrate to the second position, and subjecting the surface of the thus formed metal inorganic/organic compound layer to the second gas of the $H_2O$ gas and/or $O_2$ gas under the condition of molecular flow, the gas pressure in the reaction chamber ranging between 1 and several tens of milli-Torr, for a duration of replacing the metal inorganic/organic compound layer to the metal oxide layer.

11. A method of manufacturing an active matrix display device as recited in claim 10, wherein said metal inorganic/organic compound in the depositing step of the protection layer is anyone or a combination selected from either the group of aluminum chloride, aluminum bromide, trimethylaluminum, triethylaluminum, dimethylaluminum chloride and diethylaluminum chloride for growing aluminum oxide, or the group of titanium chloride and titanium bromide for growing titanium oxide.

12. A method of manufacturing an active matrix display device, comprising first and second substrates forming an enclosure, a plurality of display elements arranged in rows and columns, each display element comprising first and second transparent electrodes formed on inside surfaces of the first and second substrates respectively and light influencing material therebetween, a plurality of thin film transistors formed on the first substrate, the thin film transistor located at each corresponding position of the display elements and having a gate electrode, a gate insulation layer, a semiconductor layer, and source and drain electrodes, gate bus lines and source/drain bus lines formed on the first substrate for driving the display elements through the thin film transistors, the gate bus line connecting the gate electrodes located in the row direction and the source/drain bus line connecting the source/drain electrodes in the column direction, said display device further comprising an auxiliary capacitor corresponding to each said display element formed by the first transparent electrode and another auxiliary electrode formed on the first substrate, having a capacitor insulation layer therebetween, said manufacturing method comprising the following steps of forming the capacitor insulation layer:

provphng a reaction chamber comprising first and second gas inlets and a barrier gas inlet, an outlet for exhausting these gases and means for transferring a substrate between first and second positions within said reaction chamber and flowing the first and second gases and the barrier gas, wherein the first and second gas inlets and the barrier gas inlet and the gas outlet are arranged such that only the barrier gas flow separates the first and second gases under a condition of molecular flow and defines said first and second positions, and such that the substrate at the first position is exposed to the first gas and the substrate at the second position is exposed to the second gas under the condition of molecular flow;

forming the auxiliary electrode on the first substrate;

depositing the capacitor insulation layer on the auxiliary electrode by a method which comprises performing a specified number of repeated cycles of disposing the first substrate at the first position and subjecting it to the first gas of a metal inorganic/organic compound, which can react with $H_2O$ and/or $O_2$ and form the metal oxide under the condition of molecular flow, the gas pressure in the reaction chamber ranging between 1 and several tens of milli-Tort, for a duration of depositing almost a single atomic layer, and transferring said first substrate to the second position, and subjecting the surface of the thus formed metal inorganic/organic compound layer to the second gas of the $H_2O$ gas and/or $O_2$ gas under the condition of molecular flow, the gas pressure in the reaction chamber ranging between 1 and several tens of milli-Torr, for a duration of replacing the metal inorganic/organic compound layer to the metal oxide layer; and forming the first transparent electrode on the capacitor insulation layer.

13. A method of manufacturing an active matrix display device as recited in claim 12, wherein said metal inorganic/organic compound in the depositing step of the capacitor insulation layer is anyone or a combination selected from either the group of aluminum chloride, aluminum bromide, trimethylaluminum, triethylaluminum, dimethylaluminum chloride and diethylaluminum chloride for growing aluminum oxide, or the group of titanium chloride and titanium bromide for growing titanium oxide.

14. A method of forming a thin insulation layer used in an active matrix display device, the thin insulation layer being used as any one among a gate insulation layer for a thin film transistor, an inter-busline insulation layer, a protective layer on a thin film transistor and an insulation layer for an auxiliary capacitor, said method comprising the steps of:

providing a reaction chamber and means for transferring a substrate between first and second positions within said reaction chamber, and providing a first gas of a metal inorganic/organic compound at said first position and a second gas of $H_2O$ gas and/or $O_2$ gas at said second position, and providing a barrier gas flow separating said first gas and said second gas such that only the barrier gas flow separates the first and second gases under a condition of molecular flow, wherein the substrate at the first position is exposed to the first gas and the substrate at the second position is exposed to the second gas; and performing a specified number of repeated cycles of:
disposing a substrate at said first position within said reaction chamber and subjecting it to said first gas of a metal inorganic/organic compound, which can react with $H_2O$ and/or $O_2$ and form the metal oxide, under the condition of molecular flow, the gas pressure in the reaction chamber ranging between 1 and several tens of milli-Tort, for duration of depositing almost a single atomic layer; and transferring the substrate to said second position within said reaction chamber and subjecting the surface of a thus formed metal inorganic/organic compound layer on said substrate to the $H_2O$ gas and/or $O_2$ gas under the condition of molecular flow, the gas pressure in the reaction chamber ranging between 1 and several tens of milli-Tort, for a duration of replacing the metal inorganic/organic compound layer to the metal oxide layer.

15. A method of forming a thin insulation layer as recited in claim 14, wherein said metal inorganic/organic compound is any one or a combination selected from either the group of aluminum chloride, aluminum bromide, trimethylaluminum, triethylaluminum, dimethylaluminum chloride and diethylaluminum chloride for growing aluminum oxide, or the group of titanium chloride and titanium bromide for growing titanium oxide.

16. A method of forming a thin insulation layer in an active matrix display device, the insulation layer being used as any one among a gate insulation layer for a thin film transistor and an insulation layer for an auxiliary capacitor, said method comprising the steps of:

(a) providing a reaction chamber comprising first and second gas inlets and a barrier gas inlet, an outlet for exhausting these gases and means for transferring a substrate between first and second positions within said reaction chamber and flowing the first and second gases and the barrier gas, wherein the first and second gas inlets and the barrier gas inlet and the gas outlet are arranged such that only the barrier gas flow separates the first and second gases under a condition of molecular flow and defines said first and second positions, and such that the substrate at the first position is exposed to the first gas and the substrate at the second position is exposed to the second gas under the condition of molecular flow;

(b) disposing said first substrate at the first position and subjecting it to the first gas of aluminum chloride under the condition of molecular flow, the gas pressure in the reaction chamber ranging between 1 and several tens of milli-Torr, for a duration of depositing almost a single atomic layer;

(c) transferring said first substrate to the second position, and subjecting the surface of a thus formed aluminum chloride layer to the second gas of a vapor of $H_2O$ and/or $O_2$ under the condition of molecular flow, the gas pressure in the reaction chamber ranging between 1 and several tens of milli-Torr, for a duration of replacing the aluminum chloride layer to an aluminum oxide layer;

(d) transferring said first substrate to the first position, and subjecting the surface of the aluminum oxide layer to the another first gas of titanium chloride under the condition of molecular flow, the gas pressure in the reaction chamber ranging between 1 and several tens of milli-Torr, for a duration of depositing almost a single atomic layer;

(e) transferring said first substrate to the second position, and subjecting the surface of a thus formed titanium-chloride layer to the second gas of a vapor of $H_2O$ and/or $O_2$ under the same condition as in step (c) for a duration of replacing the titanium chloride layer to a titanium oxide layer, and (f) repeating the steps (b) through (e) for plural cycles until a specified thickness of the insulation layer is grown.

17. A method of forming a thin film transistor on a substrate comprising a gate electrode, a gate insulation layer, a semiconductor layer, and source and drain electrodes, wherein said method comprises performing the following steps of forming the gate insulation layer:

(a) providing a reaction chamber comprising first and second gas inlets and a barrier gas inlet, an outlet for exhausting these gases and means for transferring a substrate between first and second positions within said reaction chamber and flowing the first and second gases and the barrier gas, wherein the first and second gas inlets and the barrier gas inlet and the gas outlet are arranged such that only the barrier gas flow separates the first and second gases under a condition of molecular flow and defines said first and second positions, and such that the substrate at the first position is exposed to the first gas and the substrate at the second position is exposed to the second gas under the condition of molecular flow;

(b) disposing said first substrate at the first position and subjecting it to the first gas of a metal inorganic/organic compound, which can react with $H_2O$ and/or $O_2$ and form the metal oxide under the condition of molecular flow, the gas pressure in the reaction chamber ranging between 1 and several tens of milli-Torr, for a duration of depositing almost a single atomic layer;

(c) transferring said first substrate to the second position and subjecting the surface of a metal inorganic/organic compound layer formed in step (b) to the second gas of the $H_2O$ gas and/or $O_2$ gas under the condition of molecular flow, the gas pressure in the reaction chamber ranging between 1 and several tens of milli-Torr, for a duration of replacing the metal inorganic/organic compound layer to the metal oxide layer; and (d) repeating the steps (b) and (c) alternately for plural cycles until a specified thickness of the metal oxide layer is grown.

18. A method of forming a thin film transistor as recited in claim 17, wherein said method further comprises the following steps of:

(d) depositing a second gate insulation layer of silicon nitride on said gate insulation layer by a plasma CVD method; and (e) depositing the amorphous silicon semiconductor layer on the second insulation layer by the plasma CVD method using the same apparatus in the step (d).

* * * * *